United States Patent
Hallowell et al.

(10) Patent No.: US 9,946,590 B2
(45) Date of Patent: Apr. 17, 2018

(54) TRANSMISSION OF COMMAND STRINGS AND STATUS STRINGS VIA MEMORY BUS

(71) Applicant: HEWLETT PACKARD ENTERPRISE DEVELOPMENT LP, Houston, TX (US)

(72) Inventors: William C Hallowell, Spring, TX (US); Chuan Lee, Houston, TX (US); Stephen Carpenter Knowles, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 162 days.

(21) Appl. No.: 15/039,166

(22) PCT Filed: Dec. 19, 2013

(86) PCT No.: PCT/US2013/076395
§ 371 (c)(1),
(2) Date: May 25, 2016

(87) PCT Pub. No.: WO2015/094258
PCT Pub. Date: Jun. 25, 2015

(65) Prior Publication Data
US 2017/0161128 A1 Jun. 8, 2017

(51) Int. Cl.
*G06F 11/00* (2006.01)
*G06F 11/07* (2006.01)
*G06F 11/10* (2006.01)
*G11B 20/18* (2006.01)
*G11C 29/04* (2006.01)
*H04L 1/00* (2006.01)
*H04N 7/00* (2011.01)

(52) U.S. Cl.
CPC ........ *G06F 11/073* (2013.01); *G06F 11/0721* (2013.01); *G06F 11/0727* (2013.01); *G06F 11/0766* (2013.01); *G06F 11/1004* (2013.01); *G06F 11/1012* (2013.01); *G06F 11/1044* (2013.01); *G06F 11/1076* (2013.01); *G11B 20/18* (2013.01); *G11C 29/04* (2013.01); *H04L 1/0061* (2013.01); *H04N 7/00* (2013.01)

(58) Field of Classification Search
CPC ............... G06F 11/073; G06F 11/0727; G06F 11/1004; G06F 11/1044
USPC ........................................................ 711/156
See application file for complete search history.

(56) References Cited

U.S. PATENT DOCUMENTS 6,820,463 B2 11/2004 Fletcher et al.
7,021,511 B2 4/2006 Popovich et al.
(Continued)

OTHER PUBLICATIONS

International Searching Authority, The International Search Report and the Written Opinion, dated Sep. 18, 2014, 9 Pages, PCT/US2013/076395.
(Continued)

Primary Examiner — Philip Guyton
(74) Attorney, Agent, or Firm — Hewlett Packard Enterprise Patent Department

(57) ABSTRACT

Example implementations relate to facilitating communication between a memory module and a central processor. In example implementations, a memory module may receive, via a memory bus, a plurality of command strings. The received plurality of command strings may be stored at a reserved set of addresses on the memory module.

15 Claims, 8 Drawing Sheets

(56) References Cited

U.S. PATENT DOCUMENTS

| | | | |
|---|---|---|---|
| 7,386,654 B2* | 6/2008 | Dover | G11C 7/1045 |
| | | | 711/103 |
| 7,644,216 B2 | 1/2010 | Fahr et al. | |
| 7,711,887 B1 | 5/2010 | Warnes et al. | |
| 8,583,835 B1* | 11/2013 | Kan | G06F 3/0622 |
| | | | 341/106 |
| 9,128,634 B1* | 9/2015 | Kang | G06F 3/0659 |
| 2003/0233524 A1* | 12/2003 | Poisner | G06F 12/1441 |
| | | | 711/156 |
| 2005/0086421 A1* | 4/2005 | Nassar | G06F 3/0626 |
| | | | 711/103 |
| 2006/0239095 A1 | 10/2006 | Shi et al. | |
| 2007/0136501 A1* | 6/2007 | Chang | G06F 13/4291 |
| | | | 710/105 |
| 2008/0046796 A1 | 2/2008 | Dell et al. | |
| 2008/0244175 A1* | 10/2008 | Furuichi | G06F 13/4239 |
| | | | 711/114 |
| 2008/0307187 A1 | 12/2008 | Schopp | |
| 2009/0006886 A1 | 1/2009 | O'Connor et al. | |
| 2011/0279465 A1 | 11/2011 | Radke | |
| 2012/0198155 A1* | 8/2012 | Heider | G06F 13/385 |
| | | | 711/115 |
| 2013/0103897 A1 | 4/2013 | Rajan et al. | |
| 2014/0244900 A1* | 8/2014 | Tzeng | G06F 13/1694 |
| | | | 711/103 |

OTHER PUBLICATIONS

Mellor, C.; "SMART Storage: Super DIMM sum adds up to tasty flash soup" Aug. 8, 2013; 4 pages.

* cited by examiner

TRANSMISSION OF COMMAND STRINGS AND STATUS STRINGS VIA MEMORY BUS

BACKGROUND

Data may be transferred between computing devices and memory modules via memory buses. Data bits may be transferred with error-correcting code (ECC) bits to allow errors in the data to be detected and/or corrected. To save power, memory controllers of computing devices may perform bit scattering when transmitting data.

BRIEF DESCRIPTION OF THE DRAWINGS

The following detailed description references the drawings, wherein.

DETAILED DESCRIPTION

Central processors of computing devices may communicate with memory modules via System Management Buses (SMBs) or Inter-Integrated Circuit ($I^2C$) buses for thermal management, memory configuration, memory reliability, and error logging purposes. Data may be transferred between central processors and memory modules via memory buses, such as double data rate type three (DDR3) buses. SMB and $I^2C$ bus speeds are much slower than memory bus speeds (e.g., clock speeds for SMBs and $I^2C$ buses may be around 100 kHz, while clock speeds for DDR3 buses may be several hundred MHz). SMB or $I^2C$ bus speeds may be sufficient for memory backup/restore functions, but may be too slow for runtime manipulation of commands and statuses between central processors and memory modules. Memory buses may thus be more suitable for transferring commands and statuses between central processors and memory modules during runtime.

Command bits transferred via memory buses may be scrambled by bit scattering and/or mixed with error-correcting code (ECC) bits. Memory modules that are unaware of the bit-scattering and/or ECC schemes used by a central processor may not recognize commands that are received from the central processor. In addition, central processors may expect to receive status bits with the proper ECC bits from memory modules. A memory module that has not been informed of the ECC scheme used by a central processor may not be able to provide valid status updates to the central processor.

In light of the above, the present disclosure enables memory bus-speed communication between computing devices and memory modules that is not subject to a particular ECC or data scrambling/encoding scheme. Thus, commands and statuses may be transferred between computing devices and memory modules at high speeds while conserving power and preserving data integrity.

Figure 1:
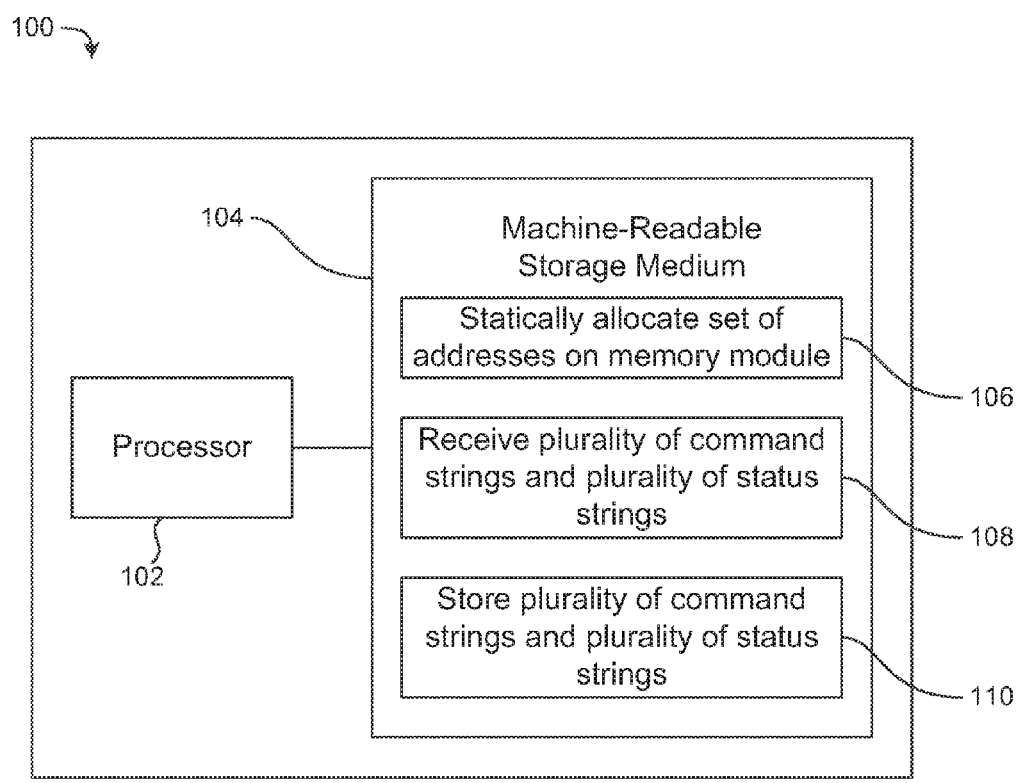
FIG. 1 is a block diagram of an example memory module that includes a machine-readable storage medium encoded with instructions that enable communication between the memory module and a central processor.

Referring now to the drawings, FIG. 1 is a block diagram of an example memory module 100 that includes a machine-readable storage medium encoded with instructions that enable communication between the memory module and a central processor. As used herein, the term "central processor" should be understood to refer to a processor, in a computing device, that performs input/output operations of the computing device. As used herein, the terms "include", "have", and "comprise" are interchangeable and should be understood to have the same meaning. Memory module 100 may be an in-line memory module, such as a single in-line memory module (SIMM) or a dual in-line memory module (DIMM), or any memory module suitable for mounting memory integrated circuits (ICs). Memory module 100 may be communicatively coupled to a computing device, such as a notebook computer, desktop computer, workstation, tablet computing device, mobile phone, electronic book reader, or server. In FIG. 1, memory module 100 includes processor 102 and machine-readable storage medium 104.

Processor 102 may include a central processing unit (CPU), microprocessor (e.g., semiconductor-based microprocessor), and/or other hardware device suitable for retrieval and/or execution of instructions stored in machine-readable storage medium 104. Processor 102 may fetch, decode, and/or execute instructions 106, 108, and 110 to enable communication between memory module 100 and a central processor, as described below. As an alternative or in addition to retrieving and/or executing instructions, processor 102 may include an electronic circuit comprising a number of electronic components for performing the functionality of instructions 106, 108, and/or 110.

Machine-readable storage medium 104 may be any suitable electronic, magnetic, optical, or other physical memory that contains or stores executable instructions. Thus, machine-readable storage medium 104 may include, for example, a random-access memory (RAM), an Electrically Erasable Programmable Read-Only Memory (EEPROM), a storage device, an optical disc, and the like. In some implementations, machine-readable storage medium 104 may include a non-transitory storage medium, where the term "non-transitory" does not encompass transitory propagating signals. As described in detail below, machine-readable storage medium 104 may be encoded with a set of executable instructions 106, 108, and 110.

Instructions 106 may statically allocate a set of addresses on memory module 100. As used herein, the term "static", as used with respect to addresses on a memory module, should be understood to refer to memory addresses that are written to once, after which the addresses are not written to again as long as the memory module has power (e.g., once data is written to a static address, the contents of that address remain the same and that address is not used to store any other data as long as the memory module has power). As used herein, the term "statically", as used with respect to allocation of addresses on a memory module, should be understood to refer to a designation of certain memory addresses on the memory module as static addresses. Instructions 106 may statically allocate a set of addresses on a volatile memory (e.g., dynamic random-access memory [DRAM]) and/or a non-volatile memory (e.g., flash memory) of memory module 100.

Instructions 108 may receive a plurality of command strings and a plurality of status strings. The plurality of command strings and the plurality of status strings may be received via a memory bus. As used herein, the term "memory bus" should be understood to refer to a computer bus that transfers information between a central processor of a computing device and memories on a memory module. In some implementations, the plurality of command strings and plurality of status strings may be received during an initial transmission from a central processor to memory module 100. As used herein, the term "initial transmission" should be understood to refer to the first transmission of data from a central processor to a memory module during initialization/booting of the memory module.

Each of the plurality of command strings may include command bits and ECC bits. Command bits may encode commands (e.g., save data, delete data) that a central processor may send to a memory module after an initial transmission. ECC bits transmitted with command bits corresponding to a particular command may vary depending on the ECC scheme used by the central processor. The number of command strings received by memory module 100 (e.g., during an initial transmission) may be the number of possible distinct commands that a central processor may send to memory module 100.

Each of the plurality of status strings may include status bits and ECC bits. Status bits may encode statuses that a memory module may send to a central processor to indicate various states of the memory module (e.g., the memory module is still busy executing a command received from the central processor, the memory module is done performing an operation in response to a command). ECC bits transmitted with status bits corresponding to a particular status may vary depending on the ECC scheme used by the central processor. The number of status strings received by memory module 100 (e.g., during an initial transmission) may be the number of possible distinct states of memory module 100 that may be indicated to a central processor.

Instructions 110 may store the received plurality of command strings and plurality of status strings at the statically allocated set of addresses. The plurality of command strings and plurality of status strings may be stored on a volatile memory (e.g., DRAM) and/or a non-volatile memory (e.g., flash memory) of memory module 100. The stored plurality of command strings may be used to identify commands received from a central processor after an initial transmission, as discussed further with respect to FIGS. 2 and 7. The stored plurality of status strings may be used when providing a status update to a central processor, as discussed with respect to FIGS. 3 and 6.

Figure 2:
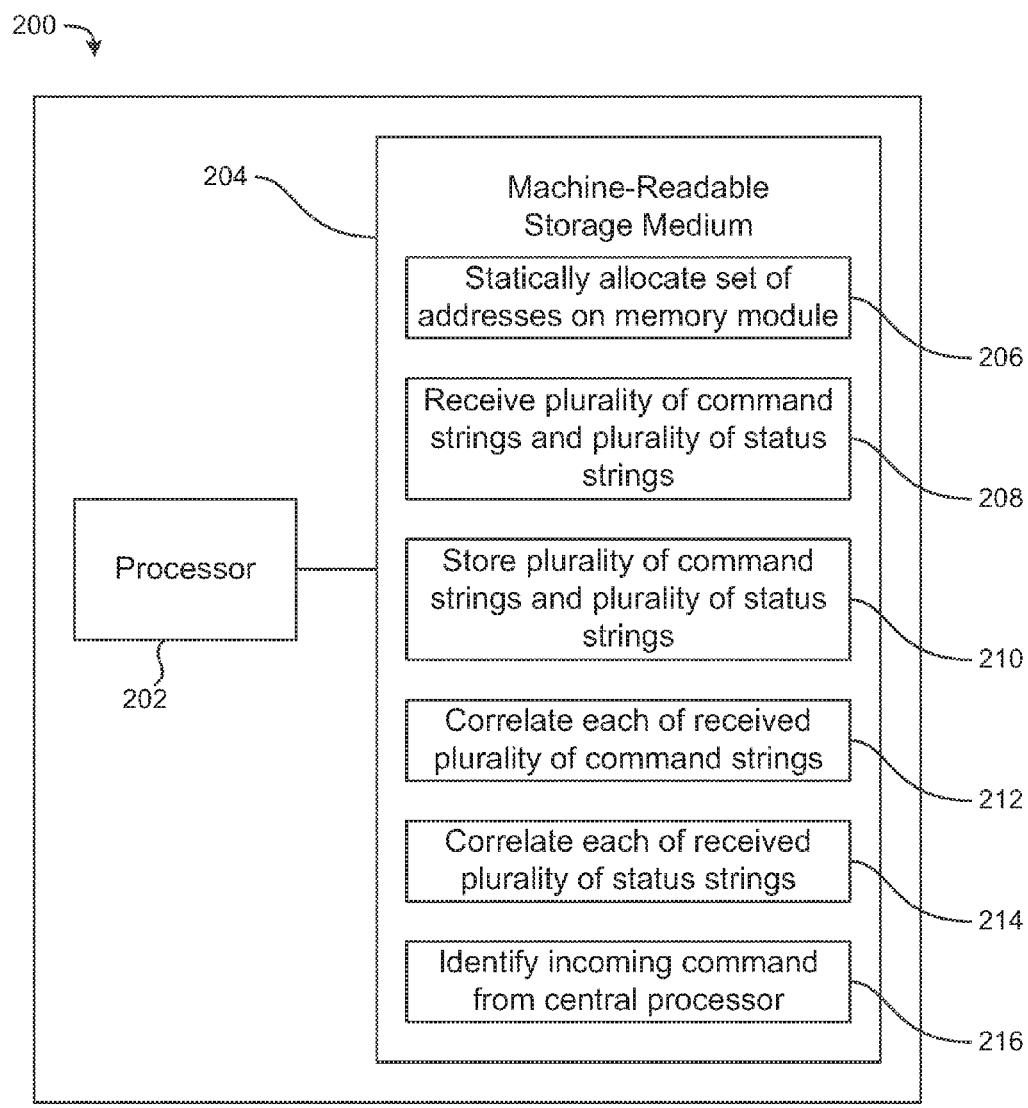
FIG. 2 is a block diagram of an example memory module that includes a machine-readable storage medium encoded with instructions that enable identification of an incoming command from a central processor.

FIG. 2 is a block diagram of an example memory module 200 that includes a machine-readable storage medium encoded with instructions that enable identification of an incoming command from a central processor. Memory module 200 may be an in-line memory module, such as a SIMM or DIMM, or any memory module suitable for mounting memory ICs. Memory module 200 may be communicatively coupled to a computing device, such as a notebook computer, desktop computer, workstation, tablet computing device, mobile phone, electronic book reader, or server. In FIG. 2, memory module 200 includes processor 202 and machine-readable storage medium 204.

As with processor 102 of FIG. 1, processor 202 may include a CPU, microprocessor (e.g., semiconductor-based microprocessor), and/or other hardware device suitable for retrieval and/or execution of instructions stored in machine-readable storage medium 204. Processor 202 may fetch, decode, and/or execute instructions 206, 208, 210, 212, 214, and 216 to enable identification of an incoming command from a central processor, as described below. As an alternative or in addition to retrieving and/or executing instructions, processor 202 may include an electronic circuit comprising a number of electronic components for performing the functionality of instructions 206, 208, 210, 212, 214, and/or 216.

As with machine-readable storage medium 104 of FIG. 1, machine-readable storage medium 204 may be any suitable physical memory that stores executable instructions. Instructions 206, 208, and 210 on machine-readable storage medium 204 may be analogous to (e.g., have functions and/or components similar to) instructions 106, 108, and 110 on machine-readable storage medium 104. Instructions 212 may correlate each of a received plurality of command strings to a command in a list of commands known to memory module 200. The plurality of command strings may be received via a memory bus, such as a double data rate (DDR) bus, during an initial transmission from a central processor to memory module 200. The correlation of received command strings to known commands may be based on an order in which the plurality of command strings are received. For example, memory module 200 may be programmed (e.g., via a Basic Input/Output System [BIOS]) with a list of known commands that are in a particular order, and instructions 212 may correlate the first command string in an initial transmission with the first known command in the list, correlate the second command string in the initial transmission with the second known command in the list, and so on.

Instructions 214 may correlate each of a received plurality of status strings to a status in a list of statuses known to memory module 200. The plurality of status strings may be received via a memory bus, such as a DDR bus, during an initial transmission from a central processor to memory module 200. The correlation of received status strings to known statuses may be based on an order in which the plurality of status strings are received. For example, memory module 200 may be programmed (e.g., via a BIOS) with a list of known statuses that are in a particular order, and instructions 214 may correlate the first status string in an initial transmission with the first known status in the list, correlate the second status string in the initial transmission with the second known status in the list, and so on.

Instructions 216 may identify an incoming command from a central processor. Memory module 200 may receive incoming commands via a memory bus. An incoming command may be identified after the plurality of command strings and the plurality of status strings are stored by instructions 210. An incoming command may be identified based on the stored and correlated plurality of command strings. In some implementations, the incoming command, which may include bits encoding the command as well as ECC bits, may be compared to the stored plurality of command strings. Instructions 216 may identify a command string of the stored plurality of command strings that matches the incoming command. Instructions 216 may determine which command in the known list of commands correlates to the matching command string. For example, the incoming command may match the fifth command string of the stored plurality of command strings (e.g., the fifth command string received during an initial transmission), and instructions 216 may determine that the fifth command in the known list of commands correlates to the fifth command string. Memory module 200 may thus recognize an incoming command from a central processor and perform the appropriate operation(s) without knowing the bit-scattering and/or ECC scheme used by the central processor.

Figure 3:
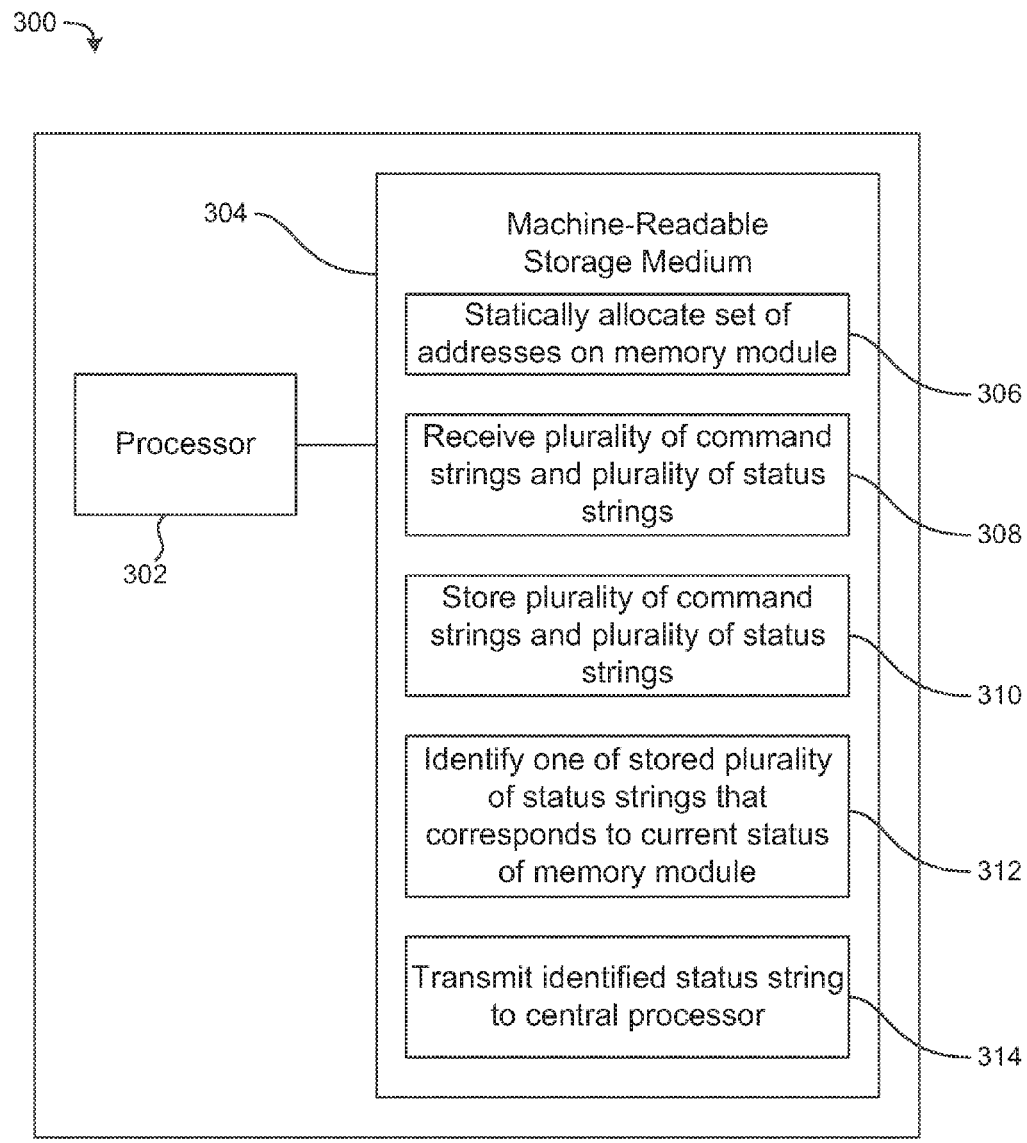
FIG. 3 is a block diagram of an example memory module that includes a machine-readable storage medium encoded with instructions that enable transmission of a status of the memory module to a central processor.

FIG. 3 is a block diagram of an example memory module 300 that includes a machine-readable storage medium encoded with instructions that enable transmission of a status of the memory module to a central processor. Memory module 300 may be an in-line memory module, such as a SIMM or DIMM, or any memory module suitable for mounting memory ICs. Memory module 300 may be communicatively coupled to a computing device, such as a notebook computer, desktop computer, workstation, tablet computing device, mobile phone, electronic book reader, or server. In FIG. 3, memory module 300 includes processor 302 and machine-readable storage medium 304.

As with processor 102 of FIG. 1, processor 302 may include a CPU, microprocessor (e.g., semiconductor-based microprocessor), and/or other hardware device suitable for retrieval and/or execution of instructions stored in machine-readable storage medium 304. Processor 302 may fetch, decode, and/or execute instructions 306, 308, 310, 312, and 314 to enable transmission of a status of the memory module to a central processor, as described below. As an alternative or in addition to retrieving and/or executing instructions, processor 302 may include an electronic circuit comprising a number of electronic components for performing the functionality of instructions 306, 308, 310, 312, and/or 314.

As with machine-readable storage medium 104 of FIG. 1, machine-readable storage medium 304 may be any suitable physical memory that stores executable instructions. Instructions 306, 308, and 310 on machine-readable storage medium 304 may be analogous to instructions 106, 108, and 110 on machine-readable storage medium 104. Instructions 312 may identify one of a stored plurality of status strings that corresponds to a current status of memory module 300. In some implementations, each of the stored plurality of status strings may be correlated, based on an order in which the plurality of status strings were received during an initial transmission, to a status in a list of known statuses, as discussed above with respect to FIG. 2. Instructions 312 may determine which status in the list of known statuses matches the current status of memory module 300, and identify which stored status string correlates to the matching status. For example, the current status of memory module 300 may match the third status in the list of known statuses, and the third status string of the stored plurality of status strings (e.g., the third status string received during an initial transmission) may be identified as being correlated to the matching status.

Instructions 314 may transmit, via a memory bus (e.g., DDR bus), the identified status string to a central processor. The transmitted status string may include ECC bits. The ability to transmit the proper stored status string, which includes ECC bits, may allow memory module 300 to avoid determining how to generate ECC bits for the current status. Memory module 300 may thus transmit a valid status string to provide a status update to a central processor without knowing the ECC scheme used by the central processor.

Figure 4:
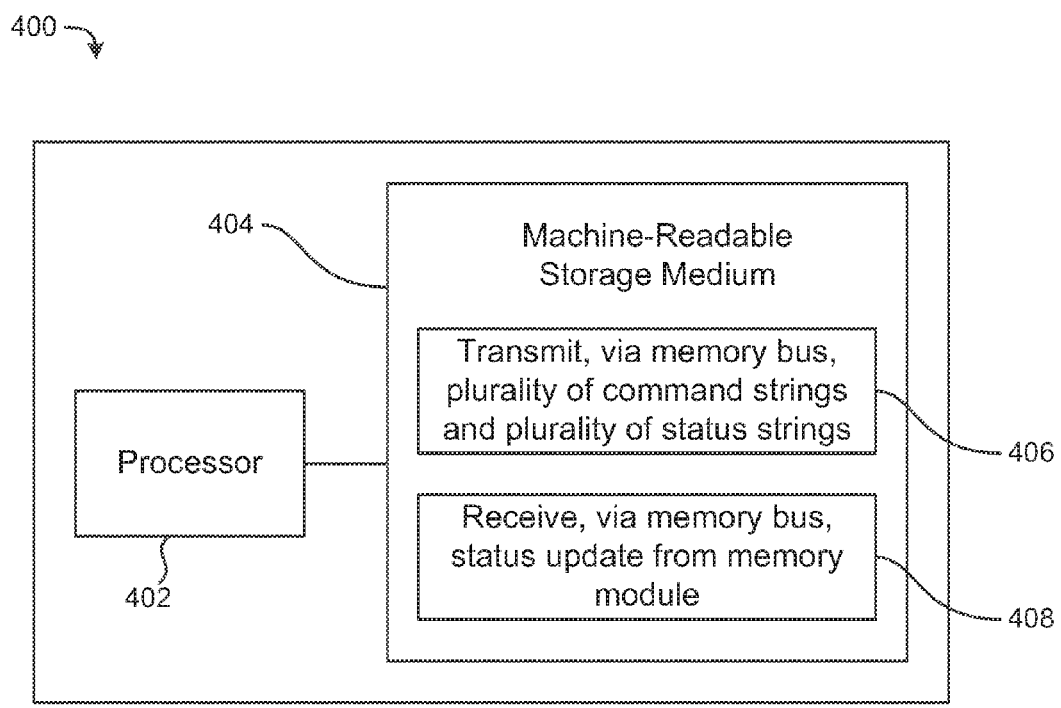
FIG. 4 is a block diagram of an example computing device that includes a machine-readable storage medium encoded with instructions that enable communication between a memory module and a central processing unit of the computing device.

FIG. 4 is a block diagram of an example computing device 400 that includes a machine-readable storage medium encoded with instructions that enable communication between a memory module and a CPU of the computing device. Computing device 400 may be a notebook computer, a desktop computer, a workstation, a tablet computing device, a mobile phone, or an electronic book reader. In some implementations, computing device 400 may operate as and/or be part of a server. In FIG. 4, computing device 400 includes processor 402 and machine-readable storage medium 404.

In some implementations, processor 402 may include a CPU of computing device 400. In some implementations, processor 402 may be communicatively coupled to a CPU of computing device 400. Processor 402 may include a microprocessor (e.g., semiconductor-based microprocessor) and/or other hardware device suitable for retrieval and/or execution of instructions stored in machine-readable storage medium 404. Processor 402 may fetch, decode, and/or execute instructions 406 and 408 to enable communication between a memory module and a CPU of computing device 400, as described below. As an alternative or in addition to retrieving and/or executing instructions, processor 402 may include an electronic circuit comprising a number of electronic components for performing the functionality of instructions 406 and/or 408.

As with machine-readable storage medium 104 of FIG. 1, machine-readable storage medium 404 may be any suitable physical memory that stores executable instructions. In some implementations, machine-readable storage medium 404 may include a non-transitory storage medium. As described in detail below, machine-readable storage medium 404 may be encoded with a set of executable instructions 406 and 408.

Instructions 406 may transmit, via a memory bus, a plurality of command strings and a plurality of status strings. In some implementations, the plurality of command strings and plurality of status strings may be transmitted during an initial transmission from computing device 400 to a memory module. The plurality of command strings and the plurality of status strings may be transmitted in an order specified by a BIOS of computing device 400. In some implementations, instructions 406 may transmit the plurality of command strings, then the plurality of status strings, or vice-versa, during an initial transmission. In some implementations, instructions 406 may alternate between transmitting command strings and transmitting status strings during an initial transmission (e.g., transmit a command string, then a status string, then another command string, then another status string, etc.). Each of the plurality of command strings may include command bits and ECC bits, and each of the plurality of status strings may include status bits and ECC bits, as discussed above with respect to FIG. 1. The memory module may receive the command strings and status strings in the order they are transmitted, and may correlate, based on this order, the command strings and status strings to known commands and statuses, respectively, as discussed above with respect to FIGS. 2-3.

Instructions 408 may receive, via the memory bus, a status update from a memory module. The received status update may include one of the plurality of status strings transmitted by computing device 400 to the memory module (e.g., during the initial transmission). The status update may indicate a current status of the memory module. For example, the status update may indicate that the memory module is busy executing a command, or that the memory module is done performing a particular operation in response to a command from computing device 400.

Figure 5:
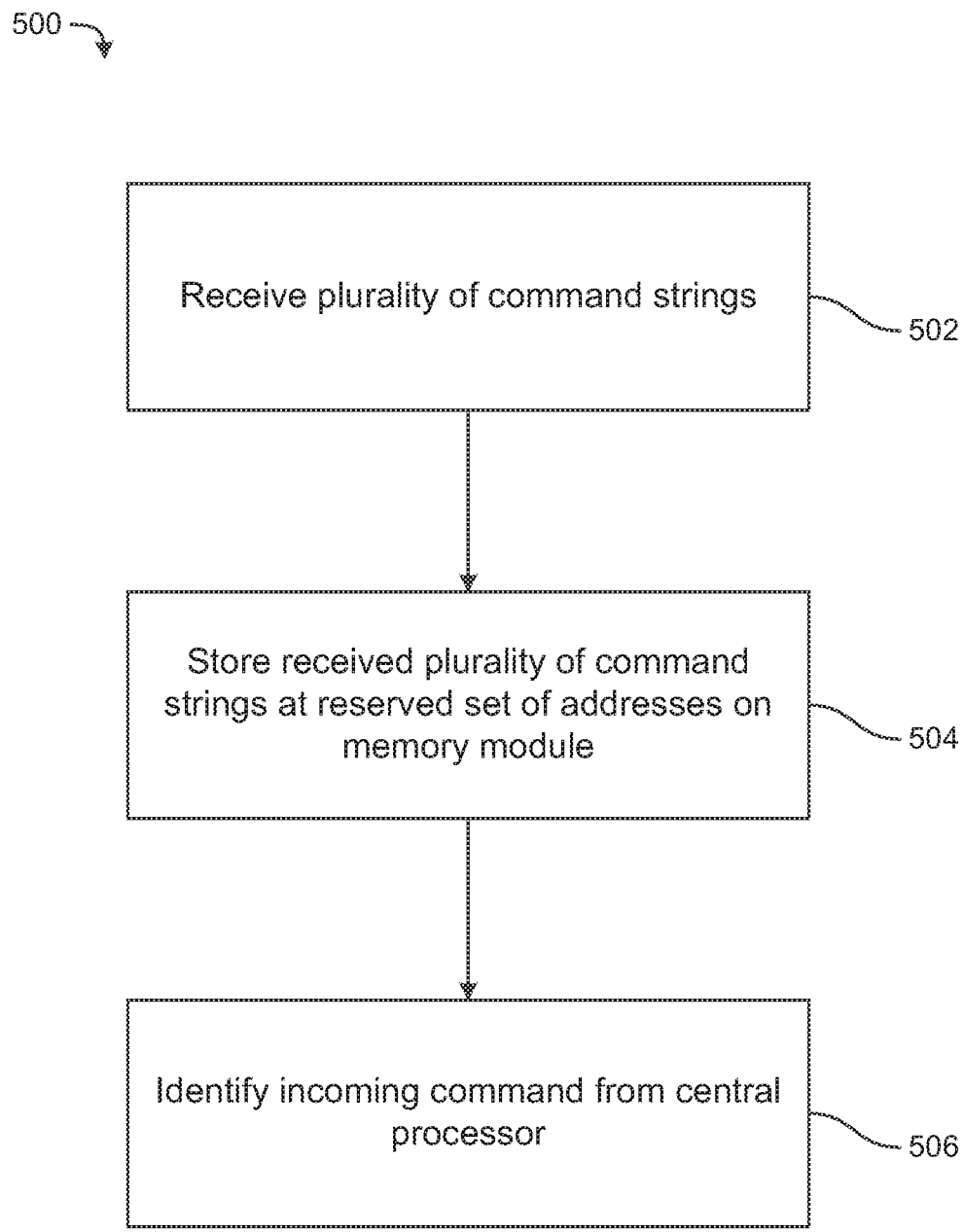
FIG. 5 is a flowchart of an example method for facilitating communication between a memory module and a central processor.

Methods related to transferring data between central processors and memory modules via memory bus are discussed with respect to FIGS. 5-8. FIG. 5 is a flowchart of an example method 500 for facilitating communication between a memory module and a central processor. Although execution of method 500 is described below with reference to processor 102 of FIG. 1, it should be understood that execution of method 500 may be performed by other suitable devices, such as processor 202 of FIG. 2. Method 500 may be implemented in the form of executable instructions stored on a machine-readable storage medium and/or in the form of electronic circuitry.

Method 500 may start in block 502, where processor 102 may receive a plurality of command strings. The plurality of command strings may be received via a memory bus. In some implementations, the plurality of command strings may be received during an initial transmission from a central processor to a memory module (e.g., memory module 100). Each of the plurality of command strings may include command bits and ECC bits, as discussed above with respect to FIG. 1.

Next, in block 504, processor 102 may store the received plurality of command strings at a reserved set of addresses on the memory module. The reserved set of addresses may include statically allocated addresses. The reserved set of addresses may be on a volatile memory (e.g., DRAM) and/or a non-volatile memory (e.g., flash memory) of the memory module.

Finally, in block 506, processor 102 may identify an incoming command from a central processor. The incoming command may be transmitted from the central processor to the memory module via the memory bus. The incoming command may be identified based on the stored plurality of command strings, as discussed further with respect to FIG. 7.

Figure 6:
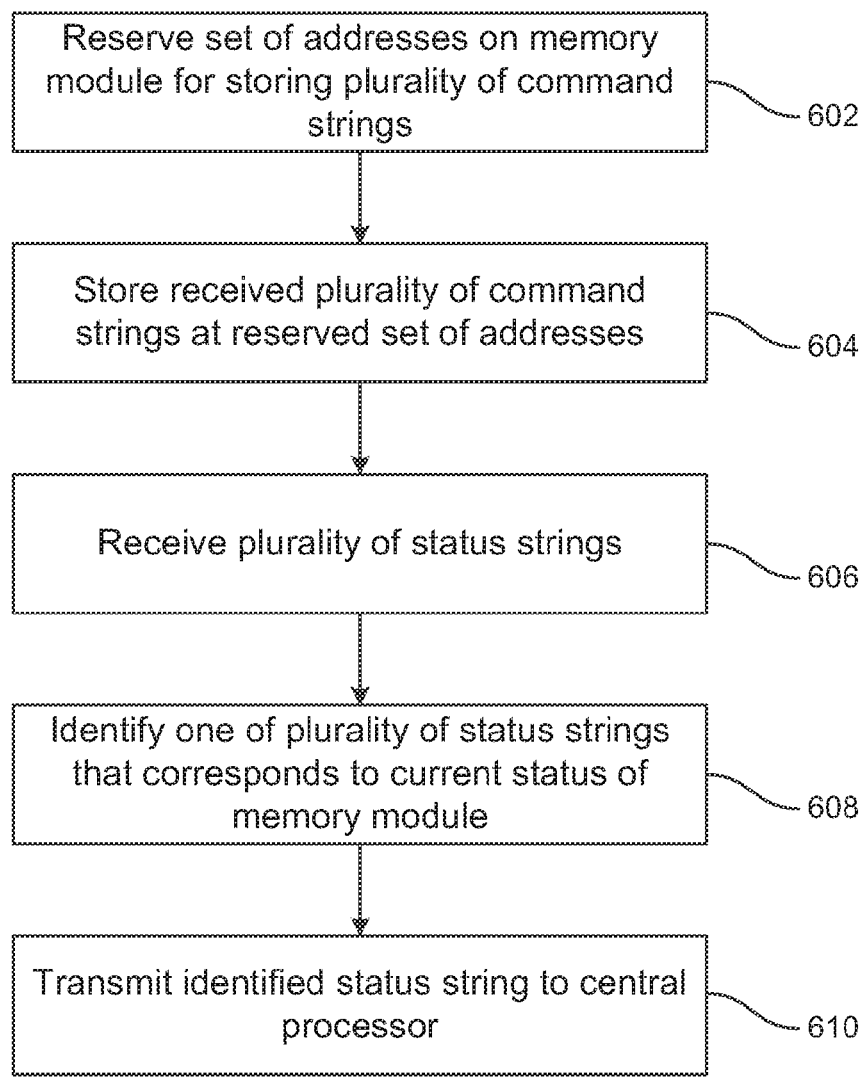
FIG. 6 is a flowchart of an example method for transmitting a status of a memory module to a central processor.

FIG. 6 is a flowchart of an example method 600 for transmitting a status of a memory module to a central processor. Although execution of method 600 is described below with reference to processor 302 of FIG. 3, it should be understood that execution of method 600 may be performed by other suitable devices, such as processors 102 and 202 of FIGS. 1 and 2, respectively. Some blocks of method 600 may be performed in parallel with and/or after method 500. Method 600 may be implemented in the form of executable instructions stored on a machine-readable storage medium and/or in the form of electronic circuitry.

Method 600 may start in block 602, where processor 302 may reserve a set of addresses on a memory module for storing a plurality of command strings. In some implementations, processor 302 may statically allocate the set of addresses, as discussed above with respect to FIG. 1. The reserved set of addresses may be on a volatile memory (e.g., DRAM) and/or a non-volatile memory (e.g., flash memory) of the memory module.

In block 604, processor 302 may store a received plurality of command strings at the reserved set of addresses. The plurality of command strings may be received during an initial transmission from a central processor to the memory module. The reserved set of addresses may remain static after the plurality of command strings are stored. Each of the plurality of command strings may include command bits and ECC bits, as discussed above with respect to FIG. 1.

In block 606, processor 302 may receive a plurality of status strings. The plurality of status strings may be received via a memory bus. In some implementations, the plurality of status strings may be received during an initial transmission from the central processor to the memory module. Each of the plurality of status strings may include status bits and ECC bits, as discussed above with respect to FIG. 1. The plurality of status strings may be stored at static addresses on the memory module. In some implementations, processor 302 may reserve (e.g., statically allocate) a set of addresses on the memory module for storing the plurality of status strings. Each of the plurality of status strings may correspond to a respective possible status of the memory module. Although block 606 is shown below blocks 602 and 604 in FIG. 6, it should be understood that block 606 may be performed before and/or in parallel with blocks 602 and/or 604.

Next, in block 608, processor 302 may identify one of the plurality of status strings that corresponds to a current status of the memory module. In some implementations, each of the stored plurality of status strings may be correlated, based on an order in which the plurality of status strings were received during the initial transmission, to a status in a list of known statuses, as discussed above with respect to FIG. 2. Processor 302 may determine which status in the list of known statuses matches the current status of the memory module, and identify which stored status string correlates to the matching status.

Finally, in block 610, processor 302 may transmit the identified status string to a central processor. The transmitted status string may include ECC bits. The ability to transmit the proper stored status string, which includes ECC bits, may allow processor 302 to avoid determining how to generate ECC bits for a current status. Processor 302 may thus transmit a valid status string to provide a status update to the central processor without knowing the ECC scheme used by the central processor.

Figure 7:
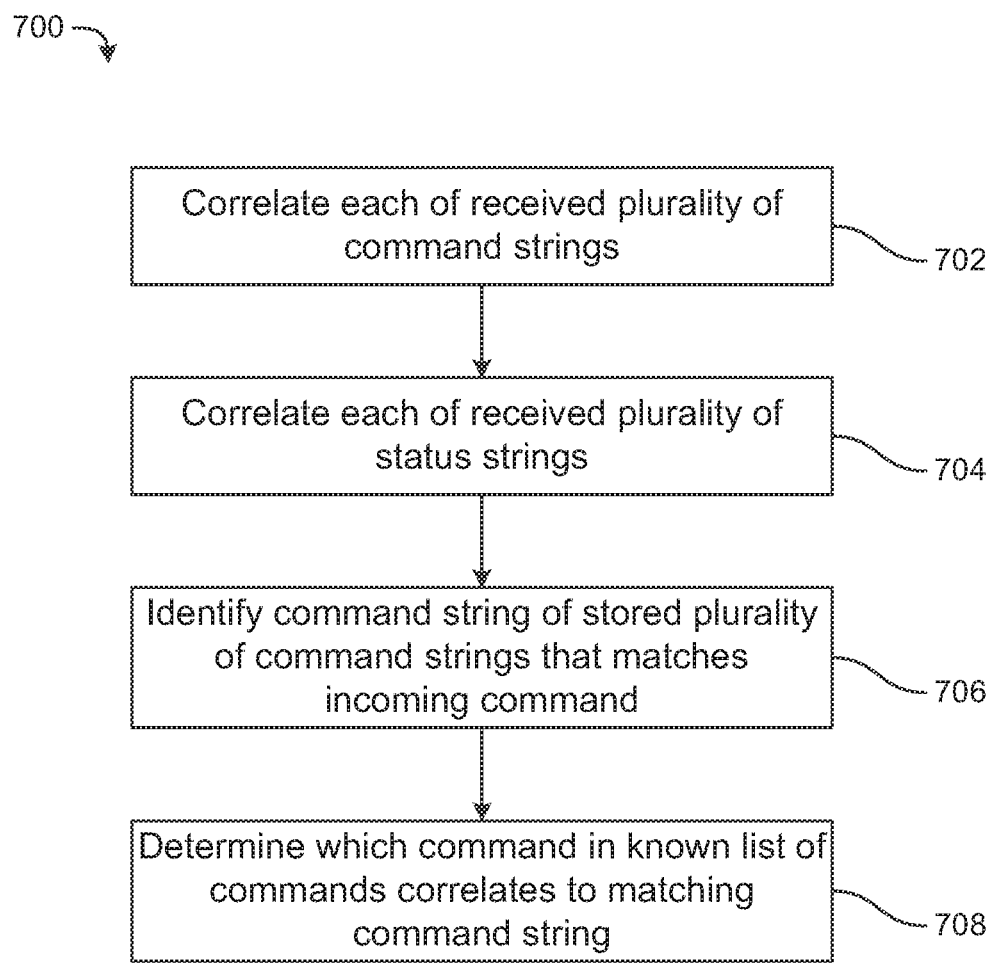
FIG. 7 is a flowchart of an example method for identifying a command from a central processor.

FIG. 7 is a flowchart of an example method 700 for identifying a command from a central processor. Although execution of method 700 is described below with reference to processor 202 of FIG. 2, it should be understood that execution of method 700 may be performed by other suitable devices, such as processors 102 and 302 of FIGS. 1 and 3, respectively. Some blocks of method 700 may be performed in parallel with and/or after methods 500 and/or 600. Method 700 may be implemented in the form of executable instructions stored on a machine-readable storage medium and/or in the form of electronic circuitry.

Method 700 may start in block 702, where processor 202 may correlate each of a received plurality of command strings to a command in a list of commands known to a memory module (e.g., memory module 200). The received plurality of command strings may be stored on the memory module. The correlation of received command strings to known commands may be based on an order in which the plurality of command strings are received. For example, the memory module may be programmed (e.g., via a BIOS) with a list of known commands that are in a particular order, and processor 202 may correlate the first command string in an initial transmission with the first known command in the list, correlate the second command string in the initial transmission with the second known command in the list, and so on.

In block 704, processor 202 may correlate each of a received plurality of status strings to a status in a list of statuses known to the memory module. The received status strings may be stored on the memory module. The correlation of received status strings to known statuses may be based on an order in which the plurality of status strings are received. For example, the memory module may be programmed with a list of known statuses that are in a particular order, and processor 202 may correlate the first status string in the initial transmission with the first known status in the list, correlate the second status string in the initial transmission with the second known status in the list, and so on.

Although block 704 is shown below block 702 in FIG. 7, it should be understood that processor 202 may correlate received status strings before or in parallel with correlating received command strings. In some implementations, processor 202 may alternate between correlating received status strings and correlating received command strings. For example, processor 202 may correlate a command string, then a status string, then another command string, then another status string, etc.

In block 706, processor 202 may identify a command string of the stored plurality of command strings that matches an incoming command from a central processor. The incoming command may be identified based on the correlating of block 702. In some implementations, processor 202 may compare the incoming command, which may include bits encoding the command as well as ECC bits, to the stored plurality of command strings to find a matching command string.

In block 708, processor 202 may determine which command in the known list of commands correlates to the matching command string. For example, the incoming command may match the second command string of the stored plurality of command strings (e.g., the second command string received during an initial transmission), and processor 202 may determine that the second command in the known list of commands correlates to the second command string. Processor 202 may thus recognize an incoming command from the central processor and perform the appropriate operation(s) without knowing the bit-scattering and/or ECC scheme used by the central processor.

Figure 8:
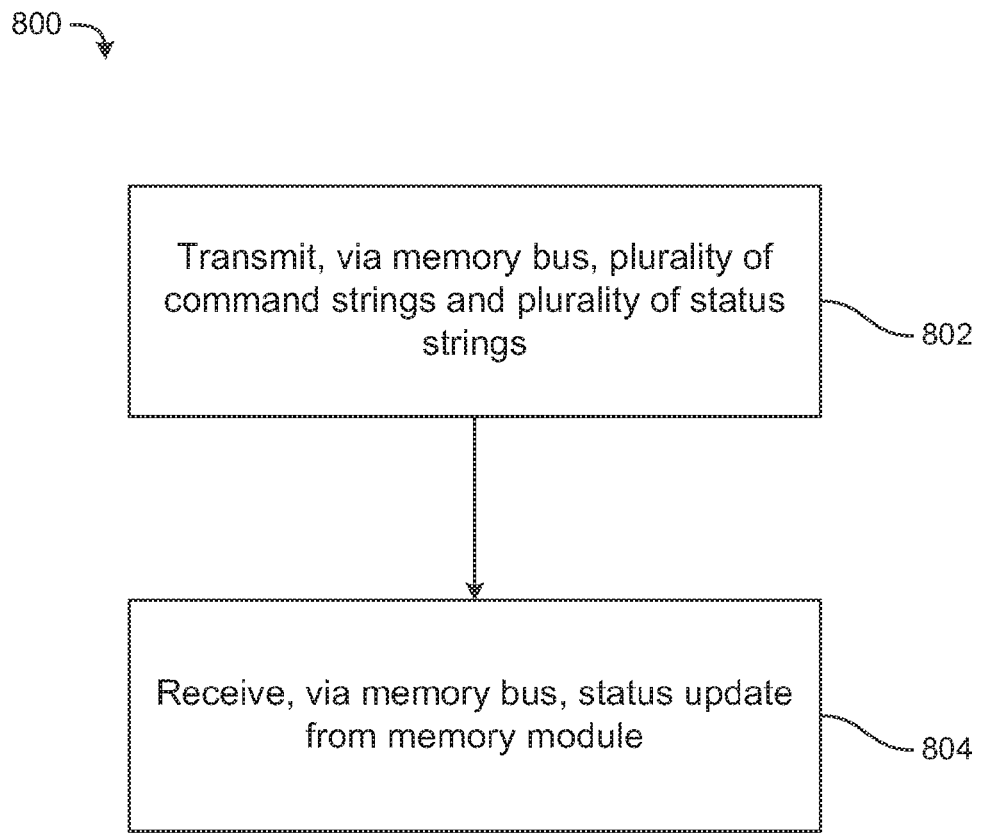
FIG. 8 is a flowchart of an example method for facilitating communication between a memory module and a central processing unit of a computing device.

FIG. 8 is a flowchart of an example method 800 for facilitating communication between a memory module and a CPU of a computing device. Although execution of method 800 is described below with reference to processor 402 of FIG. 4, it should be understood that execution of method 800 may be performed by other suitable devices. Method 800 may be implemented in the form of executable instructions stored on a machine-readable storage medium and/or in the form of electronic circuitry.

Method 800 may start in block 802, where processor 402 may transmit, via a memory bus, a plurality of command strings and a plurality of status strings. The plurality of command strings and plurality of status strings may be transmitted during an initial transmission from a CPU to a memory module. The plurality of command strings and the plurality of status strings may be transmitted in an order specified by a BIOS of a computing device. Each of the plurality of command strings may include command bits and ECC bits, and each of the plurality of status strings may include status bits and ECC bits, as discussed above with respect to FIG. 1.

Next, in block 804, processor 402 may receive, via the memory bus, a status update from the memory module. The received status update may include one of the plurality of status strings transmitted by processor 402 to the memory module (e.g., during the initial transmission). The status update may indicate a current status of the memory module. For example, the status update may indicate that the memory module is busy executing a command, or that the memory module is done performing a particular operation in response to a command from processor 402.

The foregoing disclosure facilitates communication between central processors and memory modules via memory bus. Example implementations described herein enable commands and statuses to be transferred between and understood by central processors and memory modules regardless of which ECC and/or data scrambling/encoding schemes are used.

We claim:

1. A method for facilitating communication between a memory module and a central processor, the method comprising:
   receiving, via a memory bus, a plurality of command strings;
   storing the received plurality of command strings at a reserved set of addresses on the memory module; and
   identifying, based on the stored plurality of command strings, an incoming command from the central processor, wherein the incoming command is transmitted from the central processor to the memory module via the memory bus.

2. The method of claim 1, further comprising reserving a set of addresses on the memory module for storing the plurality of command strings, wherein the reserved set of addresses remain static after the plurality of command strings are stored.

3. The method of claim 1, wherein each of the plurality of command strings comprises command bits and error-correcting code (ECC) bits.

4. The method of claim 1, further comprising:
   receiving, via a memory bus, a plurality of status strings, wherein:
      each of the plurality of status strings comprises status bits and ECC bits;
      the plurality of status strings are stored at static addresses on the memory module; and
      each of the plurality of status strings corresponds to a respective possible status of the memory module;
   identifying one of the stored plurality of status strings that corresponds to a current status of the memory module; and
   transmitting the identified status string to the central processor, wherein the transmitted status string comprises ECC bits.

5. The method of claim 4, wherein the plurality of command strings and plurality of status strings are received during an initial transmission from the central processor to the memory module, the method further comprising:
   correlating, based on an order in which the plurality of command strings are received, each of the received plurality of command strings to a command in a list of commands known to the memory module; and
   correlating, based on an order in which the plurality of status strings are received, each of the received plurality of status strings to a status in a list of statuses known to the memory module.

6. The method of claim 5, wherein identifying the incoming command from the central processor comprises:
   identifying a command string of the stored plurality of command strings that matches the incoming command; and
   determining which command in the known list of commands correlates to the matching command string.

7. A machine-readable storage medium encoded with instructions executable by a processor of a memory module for facilitating communication between the memory module and a central processor, the machine-readable storage medium comprising:
   instructions to statically allocate a set of addresses on the memory module;
   instructions to receive, via a memory bus, a plurality of command strings and a plurality of status strings; and instructions to store the received plurality of command strings and plurality of status strings at the statically allocated set of addresses.

8. The machine-readable storage medium of claim 7, wherein the plurality of command strings and plurality of status strings are received during an initial transmission from the central processor to the memory module, the machine-readable storage medium further comprising:
   instructions to correlate, based on an order in which the plurality of command strings are received, each of the received plurality of command strings to a command in a list of commands known to the memory module; and
   instructions to correlate, based on an order in which the plurality of status strings are received, each of the received plurality of status strings to a status in a list of statuses known to the memory module.

9. The machine-readable storage medium of claim 8, further comprising instructions to identify, after the plurality of command strings and the plurality of status strings are stored, and based on the stored and correlated plurality of command strings, an incoming command from the central processor.

10. The machine-readable storage medium of claim 9, further comprising:
   instructions to identify a command string of the stored plurality of command strings that matches the incoming command; and
   instructions to determine which command in the known list of commands correlates to the matching command string.

11. The machine-readable storage medium of claim 7, wherein:
   each of the plurality of command strings comprises command bits and error-correcting code (ECC) bits; and
   each of the plurality of status strings comprises status bits and ECC bits.

12. The machine-readable storage medium of claim 7, further comprising:
   instructions to identify one of the stored plurality of status strings that corresponds to a current status of the memory module; and
   instructions to transmit, via a memory bus, the identified status string to the central processor, wherein the transmitted status string comprises ECC bits.

13. A machine-readable storage medium encoded with instructions executable by a processor of a computing device for facilitating communication between a memory module and a central processing unit (CPU) of the computing device, the machine-readable storage medium comprising:
   instructions to transmit, via a memory bus, a plurality of command strings and a plurality of status strings; and
   instructions to receive, via the memory bus, a status update from the memory module, wherein the received status update comprises one of the plurality of status strings.

14. The machine-readable storage medium of claim 13, wherein:
   the plurality of command strings and the plurality of status strings are transmitted during an initial transmission from the CPU to the memory module; and
   the plurality of command strings and the plurality of status strings are transmitted in an order specified by a Basic Input/Output System (BIOS) of the computing device.

15. The machine-readable storage medium of claim 13, wherein:
   each of the plurality of command strings comprises command bits and error-correcting code (ECC) bits; and
   each of the plurality of status strings comprises status bits and ECC bits.

* * * * *